(12) United States Patent
Sulkowski, Jr. et al.

(10) Patent No.: US 8,401,488 B2
(45) Date of Patent: Mar. 19, 2013

(54) TRANSIENT RF DETECTOR AND RECORDER

(75) Inventors: Robert V. Sulkowski, Jr., Washington, PA (US); Ronald W. Zborowski, Eighty-Four, PA (US)

(73) Assignee: HPM Security Associates Limited Partner, Pittsburgh, PA (US)

( * ) Notice: Subject to any disclaimer, the term of this patent is extended or adjusted under 35 U.S.C. 154(b) by 60 days.

(21) Appl. No.: 13/081,790

(22) Filed: Apr. 7, 2011

(65) Prior Publication Data
US 2011/0181473 A1 Jul. 28, 2011

Related U.S. Application Data

(62) Division of application No. 11/807,137, filed on May 25, 2007, now Pat. No. 7,945,213.

(60) Provisional application No. 60/810,046, filed on Jun. 1, 2006.

(51) Int. Cl.
*H04B 17/00* (2006.01)

(52) U.S. Cl. ..................... 455/67.11; 342/445

(58) Field of Classification Search .............. 342/445; 307/104; 455/25, 63.4, 562.1, 575.5, 575.7, 455/67.11–67.14; 343/757
See application file for complete search history.

(56) References Cited

U.S. PATENT DOCUMENTS

| | | | |
|---|---|---|---|
| 3,483,559 A | 12/1969 | Korzekwa et al. | |
| 4,485,324 A | 11/1984 | Berlincourt et al. | |
| 6,154,178 A * | 11/2000 | Aslan | 343/718 |
| 6,424,927 B1 * | 7/2002 | Sechi et al. | 702/126 |
| 6,606,051 B1 | 8/2003 | Fullerton et al. | |
| 6,906,677 B2 | 6/2005 | Yamamoto et al. | |
| 6,930,647 B2 | 8/2005 | Wako et al. | |
| 7,005,980 B1 | 2/2006 | Schmidt et al. | |
| 2004/0096791 A1 | 5/2004 | Ichikawa et al. | |
| 2005/0075688 A1 * | 4/2005 | Toy et al. | 607/60 |

FOREIGN PATENT DOCUMENTS

JP 2004201023 * 7/2004

OTHER PUBLICATIONS

Dybdal, R.B., et al., "A Low Cost HPM Receiver", Electronics Research Laboratory, The Aerospace Corporation, 1991 IEEE, pp. 97-100.

(Continued)

*Primary Examiner* — Nay A Maung
*Assistant Examiner* — Angelica M Perez
(74) *Attorney, Agent, or Firm* — Eckert Seamans Cherin & Mellott, LLC; Kirk D. Houser

(57) ABSTRACT

A portable device for detecting a radio frequency transmission of electromagnetic radiation includes a housing; a controller situated within the housing; memory communicatively connected to the controller; an antenna connected to the controller and configured to receive the radio frequency transmission; and an audio-generating component connected to the controller. The radio frequency transmission of the electromagnetic radiation is harmful to an electrical device and is from a transient electromagnetic device (TED) threat source. The controller is operative for sensing magnitude, duration, and/or repetition of the radio frequency transmission; identifying a class of the radio frequency transmission based on one of the magnitude, duration, and repetition associated with the radio frequency transmission; and causing the audio-generating component to output tones to provide aural discrimination of an identified class of the radio frequency transmission received by the portable device. The identified class is a transient electromagnetic pulse signal from the TED source.

21 Claims, 5 Drawing Sheets

OTHER PUBLICATIONS

Narda Safety Test Solutions, "Basic insights", "Safety in electric, magnetic and electromagnetic fields", 2005, 21 pp. (pp. 1-40).

Li, X., et al., "Numerical and Experimental Investigation of an Ultrawideband Ridged Pyramidal Horn Antenna With Curved Launching Plane for Pulse Radiation", IEEE Antennas and Wireless Propagation Letters, vol. 2, 2003, pp. 259-262.

Klemm, M., et al., "Novel Small-Size Directional Antenna for UWB WBAN/WPAN Applications", IEEE Transactions on Antennas and Propagation, vol. 53, No. 12, Dec. 2005, pp. 3884-3896.

Australian Government, "Patent Examination Report No. 1", Jun. 27, 2012, 4 pp.

* cited by examiner

TRANSIENT RF DETECTOR AND RECORDER

CROSS REFERENCE TO RELATED APPLICATIONS

This application is a divisional of application Ser. No. 11/807,137, filed May 25, 2007, now U.S. Pat. No. 7,945,213 and entitled "Transient RF Detector and Recorder", the contents of which are incorporated herein by reference. This application also claims the benefit of U.S. Provisional Patent Application No. 60/810,046, filed Jun. 1, 2006, and entitled "Transient RF Detector and Recorder", the contents of which are incorporated herein by reference.

BACKGROUND OF THE INVENTION

1. Field of the Invention

The present invention relates generally to detection of electromagnetic radiation that may be harmful to a user or electrical device and, more specifically, to a device for detecting the magnitude, duration, repetition, and emission direction of the electromagnetic radiation and informing the user of same.

2. Description of Related Art

The electromagnetic pulse (EMP) effect was first observed during the early testing of high altitude airburst nuclear weapons. The effect is characterized by the production of a very short (e.g., hundreds of nanoseconds) but intense electromagnetic pulse, which propagates away from its source with ever diminishing intensity, governed by the theory of electromagnetism. The EMP is in effect an electromagnetic wave resulting in an electromagnetic field sufficiently strong to produce short-lived transient voltages, of thousands of volts, for example, on exposed electrical conductors, such as wires, or conductive tracks on printed circuit boards, where exposed.

The result may be irreversible damage to a wide range of electrical and electronic equipment, particularly computers and radio or radar receivers. Subject to the electromagnetic hardness of the electronic equipment, a measure of the equipment's resilience to this effect, and the intensity of the field produced by an EMP emission, the equipment can be irreversibly damaged or, in effect, electrically destroyed. The damage inflicted is not unlike that experienced through exposure to close proximity lightning strikes, and may require complete replacement of the equipment, or at least substantial portions thereof.

Commercial computer equipment is particularly vulnerable to EMP effects, as it is largely built up of high-density Metal Oxide Semiconductor (MOS) devices, which are very sensitive to exposure to high voltage transients. What is significant about MOS devices is that very little energy is required to permanently wound or destroy them, as any voltage typically in excess of tens of volts can produce an effect termed gate breakdown, which effectively destroys the device. Even if the pulse is not powerful enough to produce thermal damage, the power supply in the equipment will readily supply enough energy to complete the destructive process. Affected devices may still function, but their reliability will be seriously impaired. For example, the circuitry may be undamaged but data corruption has occurred. Shielding electronics by equipment chassis provides only limited protection, as any cables running in and out of the equipment will behave very much like antennae, in effect guiding the high-voltage transients into the equipment.

Computers used in data processing systems, communications systems, displays, industrial control applications, including road and rail signaling, and those embedded in military equipment, such as signal processors, electronic flight controls and digital engine control systems, are all potentially vulnerable to the EMP effect. Other electronic devices and electrical equipment may also be destroyed by the EMP effect. Telecommunications equipment can be highly vulnerable, due to the presence of lengthy copper cables between devices. Receivers of all varieties are particularly sensitive to EMP, as the highly-sensitive miniature high-frequency transistors and diodes in such equipment are easily destroyed by exposure to high-voltage electrical transients. Therefore radar and electronic warfare equipment, satellite, microwave, UHF, VHF, HF and low band communications equipment and television equipment are all potentially vulnerable to the EMP effect. Furthermore, high levels of directed electromagnetic energy may also be used to incapacitate or kill individuals, such as infantry forces.

Accordingly, there is a need to detect the presence of an EMP, a directed electromagnetic energy field, and specific forms of electromagnetic energy, such as radio frequency (RF) radiation. However, current RF detection devices of various designs either suffer from false positive alerts due to their sensitivity to local static discharge, or are relatively insensitive to transient electromagnetic pulse signals and RF signals of very short pulse duration. Current RF direction-finding (DF) devices also suffer from poor sensitivity and poor bearing resolution for transient electromagnetic pulse signals and RF signals of very short pulse duration. Current antennas used in RF-DF devices have either sensitivity limited to signals over a relatively narrow range of frequencies or sensitivity over a relatively limited range of signal polarization orientations.

Accordingly, it is, therefore, desirable to overcome the above problems and others by providing a device for detecting the magnitude, duration, repetition, and emission direction of electromagnetic radiation that may be harmful to a user or electrical device and informing the user of same. This information would be useful to provide sufficient time to protect against and neutralize continued electromagnetic radiation threats, both to electronic devices and individuals, in various environments and applications, including civilian, private, government, and military sector operations.

SUMMARY OF THE INVENTION

Accordingly, we have invented a device that alerts a user to the presence, level, and emission direction of electromagnetic radiation that may be harmful to the user and/or electrical devices.

According to a desirable embodiment, the present invention includes a portable device for detecting a predefined radio frequency (RF) transmission of electromagnetic radiation, wherein the portable device includes: (a) a housing, preferably electrically shielded; (b) a controller situated within the housing; (c) memory communicatively connected to the controller; (d) an antenna connected to the controller and configured to receive the RF transmission; and (e) an audio-generating component connected to the controller. The portable device may also include a computer interface connector, such as Universal Serial Bus (USB), communicatively connected to the controller. The controller is operative for sensing the RF transmission and identifying a class of the RF transmission based on one of magnitude, duration, and repetition associated with the RF transmission. The controller is also operative for causing the audio-generating component to output one or more tones of at least one of predefined frequency, predefined duration, and predefined repetition associated with the class of the RF transmission, whereby the one or more outputted tones provide aural discrimination of the class of the RF transmission received by the portable device.

The controller is further operative for establishing a plurality of threshold levels corresponding to ranges of at least one of the magnitude, duration, and repetition associated with the class of the RF transmission. The class of the RF transmission is selected from the group including: (a) continuous wave; (b) pulsed signals with repetition rates substantially on the order of milliseconds; (c) transient signals with repetition rates substantially on the order of seconds; and (d) random signals with no defined repetition rate.

The controller is operative for storing data representative of an occurrence of one or more of the sensed class of the RF transmission. The portable device also includes visual indicia corresponding to each of the plurality of predetermined threshold levels. An actuator may be electronically connected to the controller, wherein the controller is operative to output one of a visual and aural alert indicative of the occurrence of one or more of the class of RF transmissions at one of the plurality of threshold levels.

The portable device may include a timer connected to the controller, wherein the controller is operative for starting the timer when the controller detects that an electrical current received from a computer via the computer interface connector has ceased.

The portable device may include a rechargeable battery electrically connected to the computer interface connector, wherein the controller is configured to charge the rechargeable battery from electricity received via the computer interface connector.

Desirably, the antenna comprises a first and second monopole antenna element oriented along a same plane as each other. The antenna may further comprise a third monopole antenna element arranged in substantially perpendicular relation to the first and second monopole antenna elements, wherein the controller is operative for identifying an electric field component of the RF transmission received by one of the first, second, and third monopole antenna elements to determine the polarization of the RF transmission. In other words, the controller is operative for recording the highest signal level recovered by the three monopole elements so that the detection sensitivity is maintained for any possible polarization orientation of the RF transmission. It is to be understood that the antenna may alternatively include dipole and/or monopole antenna elements.

Candidate antennae for use in detection of high-power microwave (RPM) and transient electromagnetic device (TED) threat sources are desirably sensitive over a wide band of frequencies and sensitive to a wide range of orientations of the incoming electromagnetic (EM) waves from the threat sources.

One example approach to achieving simultaneously wideband frequency sensitivity and sensitivity to a wide range of possible orientations of the incoming EM waves involves the use of multiple monopole antenna elements directly integrated with envelope detector components associated with each monopole antenna element.

Typical HPM and TED threat sources are expected to generate significant signal energy over a range from hundreds of MHz to multiple GHz in frequency. This implies the need for antenna structures that exhibit relatively flat amplitude-bandwidth response over a decade or more in frequency. Conical monopole structures working against a ground plane have been shown in literature and practice to exhibit such wideband response. A somewhat similar response is possible in a planar structure in the form of a triangular shape monopole element working against a ground plane. The planar arrangement is easier to manufacture in the form of a printed circuit board (PCB) versus a three-dimensional metallic structure, such as a conic shape. A significant challenge to the performance of wideband antennae is encountered in the conventional approach of first optimally matching the antenna source impedance to a transmission line which is used to convey the received signals to a remotely-located detector. The antenna impedance typically varies greatly over the frequency range of interest making the wideband impedance matching difficult. This difficulty can be mitigated for the case of simple envelope detection by incorporating the envelope detector into the antenna structure with no intervening transmission line. Here, the envelope detector signal output is applied to an amplifier having high-input impedance to avoid significant loading of the detector elements. The amplified signal output is then available for further signal processing.

The simple envelope detector in this example consists of a pair of detector diodes connected in series from the signal ground plane to the high impedance amplifier input. The antenna element is connected to the circuit node between the diodes and a small shunt capacitor is connected from the amplifier input to signal ground. This circuit configuration exhibits rectification of the RF signal impressed onto the antenna to serve the function of an envelope detector.

This example antenna/detector element has the feature of simple combining of multiple elements to recover the peak detected level of two or three (or more) elements. This is possible by simple parallel connection of the detector outputs at the high-impedance amplifier input since the individual detector outputs are diodes. The rectified signal of the antenna/detector element receiving the highest RF signal is passed on to the high-impedance amplifier without significant loading by the other antenna elements.

Thus, an alternative embodiment of the present invention includes a directional-sensing wideband frequency detection device that includes: (a) a first and a second detector unit centrally situated along a first axis in a first plane; (b) a third and a fourth detector unit centrally situated along a second axis substantially perpendicular to the first axis in the first plane, wherein a point of intersection of the first and second axis is substantially equidistant from each of the detector units; (c) a respective antenna element configuration situated on a side of the first, second, third, and fourth detector unit facing away from the point of intersection, wherein each antenna element configuration includes a first, second, third, and fourth monopole element, wherein the first and second monopole elements are situated substantially perpendicular to the third and fourth monopole elements in substantially a same plane; (d) a respective detector integrated into each antenna element configuration, wherein each detector is operative for transmitting a signal, wherein the signal is representative of which of the first, second, third, and fourth monopole element has received a greatest amount of voltage from an electromagnetic radiation transmission in relation to the other monopole elements; and (e) a respective absorber material situated behind each antenna element configuration, wherein the absorber material is adapted to absorb a predefined range of electromagnetic radiation. The absorber material may be an RF attenuating material. An exemplary predefined range of electromagnetic radiation may be between 100 MHz and 10 GHz. In an alternative embodiment, the device may include a first, second, and third monopole element, wherein the first monopole element is situated in substantially 120 degree relation to the second monopole element and the second monopole element is situated in substantially 120 degree relation to the third monopole element in substantially a same plane.

The directional-sensing wideband frequency detection device may include a controller operative for: (a) receiving the respective signal from each of the first, second, third, and fourth detector units; (b) summing the signals received from the first and second detector units to obtain a first vector sum; (c) summing the signals received from the third and fourth detector units to obtain a second vector sum; and (d) summing the first and second vector sum to obtain a net bearing of an emission source of the electromagnetic radiation transmission. The controller may be further operative for: (a) sensing at least one of the magnitude, duration, and repetition of the radio frequency transmission; (b) identifying a class of the radio frequency transmission based on one of the magnitude, duration, and repetition associated with the radio frequency transmission; and (c) establishing a plurality of threshold levels corresponding to ranges of at least one of the magnitude, duration, and repetition associated with the class of the radio frequency transmission.

The directional-sensing wideband frequency detection device may also include visual indicia electrically connected thereto and corresponding to each of the plurality of threshold levels. The controller may be operative to output one of a visual and aural alert indicative of the occurrence of one or more of the class of radio frequency transmission at one of the plurality of threshold levels. The directional-sensing wideband frequency detection device may include a metallic shield substantially encasing each side of the first, second, third, and fourth detector units not having the respective antenna element configurations situated thereon.

The directional-sensing wideband frequency detection device may include a fifth detector unit centrally situated along a third axis in a second plane, wherein the third axis is perpendicular to the first and second axis and intersects the first and second axis at the point of intersection of the first and second axis, wherein the point of intersection of the first and second axis is substantially equidistant from the first, second, third, fourth, and fifth detector units. Furthermore, the directional-sensing wideband frequency detection device may also include a sixth detector unit centrally situated along the third axis in the second plane, wherein the point of intersection of the first and second axis is substantially equidistant from the first, second, third, fourth, fifth, and sixth detector units. The fifth and sixth detector units may provide a vector in a third dimension in order to facilitate resolution of directional finding bearings in three dimensions (e.g., azimuth angle and elevation angle).

The present invention also includes a device for generating a wideband frequency signal having a directed electric field polarization. The device includes: (a) a housing having an opening and cavity defined therein; (b) a high voltage pulse generator disposed within the cavity, wherein the distal end of the high voltage pulse generator is positioned in spaced relation to an interior portion of the housing such that a spark generated by the high voltage pulse generator contacts the interior portion, wherein a resultant electromagnetic wave is directed through the opening in a predefined polarization; and (c) an actuator in communication with the high voltage pulse generator, wherein the actuator is configured to cause the high voltage pulse generator to generate the spark when the actuator is operated upon by an external force. The high voltage pulse generator includes a piezoelectric material and a hammer element for striking the piezoelectric material. The high voltage pulse generator may include a battery and a solenoid, wherein the solenoid, when having a current pass thereto, causes the hammer element to strike the piezoelectric material.

Generally, the present invention detector measures a peak level of RF (i.e., the electric field or E-field component of the RF signal is measured) and compares this to one of multiple selectable levels for alarm. The present invention utilizes an algorithm change to generate distinctively different audible alarms for two categories of detected signal. RF signals of either a continuous or frequent repetition rate which exceed the selected threshold audibly alarm in one manner. Transient signals created by either local static discharge or a Transient Electromagnetic Device (TED) will audibly alarm in a different manner. Since static discharge is a random occurrence and actual TED threats typically have a relatively slow but repeatable repetition rate, a user should be able to infer that a TED is in use.

The antenna structure includes three monopole elements oriented orthogonally to each other with the balance of the shield structure and circuit elements of the unit serving as the counterpoise of the antenna elements. A diode RF envelope detector is incorporated at each of the monopoles. The three detectors are connected in parallel, such that the highest detected level is passed on to threshold detectors. This antenna exhibits the desirable feature of having received sensitivity to signals of any polarization orientation incident upon the present invention detector. In addition to a selectable alarm level setting, a series of logarithmically related threshold levels that are simultaneously active are provided to record and display the approximate peak detected signal amplitude in real-time on a bar graph display. This peak level increment can also be remotely reported via a network connection.

While the detector is intended to be normally powered by a USB port, a rechargeable battery is provided so that a forensic capture can be saved in the event of an RF attack of sufficient magnitude to damage the attached personal computer. Upon loss of USB communication, the detector will start a clock counter and also record the highest detected threshold prior to the loss. The unit can then be moved to a working computer to download the counter to determine how long ago the event occurred and download the recorded peak level. The rechargeable battery may also be used to power a handheld variation of the detector.

In an alternative embodiment of the present invention, the detector is a direction-finding (DF) antenna array that can serve as the front-end of a larger system used to determine the bearing to and relative magnitude of an RF threat signal. The DF antenna array includes four sector antenna/detector units of approximately 90 degrees beam width each. In one embodiment of the present invention, the sector antenna/detector units are arranged to sense in four azimuth quadrant directions (North/East/South/West or 0 degrees/90 degrees/180 degrees/270 degrees bearings, for example). In the desirable embodiment, the DF antenna array is designed for use in fixed mounting and vehicular mounting locations. The sector antenna/detector array capabilities may be enhanced with the addition of sector antenna/detector units looking up and down to resolve three-dimensional bearings for airborne threats that are monitored from the ground and for airborne monitoring configurations monitoring threats above and below the monitoring aircraft.

In many conventional DF systems, sector antenna outputs are coupled via RF transmission lines to receive electronics for processing. Prior art sector antennae are relatively limited in the following desirable simultaneous properties: sensitivity to signals over a wide frequency range and wide range of signal polarization orientations and relatively uniform beam width over that frequency range and the ability to efficiently couple the signals to a transmission line to convey to signal processing electronics equipment. The present DF system invention achieves the aforementioned bandwidth, beam width and arbitrary polarization sensitivity properties by incorporating diode envelope detectors within each sector antenna/detector unit. This design relieves the requirement to efficiently couple the recovered RF signals to a transmission line to convey to processing electronics. In this design, only the detected (baseband) envelope information of the detected RF signal is conveyed to the processing electronics. Accordingly, the DF sector antenna/detector units include monopole/detector elements that are co-planar but at angles to each other in their common plane. In an exemplary embodiment, four monopole/detector elements oriented in increments of 90 degrees within their common plane may be used to form the basis of each sector antenna/detector unit. However, the present invention may alternatively employ only three monopole/detector elements oriented at 120 degrees to each other in their common plane within each sector antenna/detector unit and still achieve the desired sensitivity to signals of arbitrary polarization orientation. The co-planar monopole/detectors are parallel-connected so that sensitivity to signals arriving approximately normal (+/− at least 45 degrees) to their common plane is achieved regardless of the polarization orientation of the incoming wave. Wideband directional properties are introduced to the sector antenna/detector unit by placing RF absorber material behind the plane of the monopole/detector elements. The absorber material is backed by metallic foil which also extends up the sides of the absorber. The relative size of the absorber material and the distance of metallic coverage up the sides are selected to adjust the sector beam-width to approximately 90 degrees.

Received signal bearing determination is as follows. Since the DF antenna array employs envelope detectors, only RF signal envelope information is available. The RF signal envelope (baseband) signals from opposite direction sector antenna/detector units (North/South, for example) are subtracted from each other (i.e., vector summed) to yield a net magnitude and direction along that axis. This same process is done for the other axis (East/West, for example). The two vectors may be processed to obtain a bearing and magnitude to the threat signal source. Multiple DF antenna arrays may be networked to resolve the approximate location of the threat source by triangulation. Recovered RF signal envelope time response can be used to discriminate between continuous wave and pulsed RF sources having rapid repetition rate versus TED signals and random static discharges.

The present invention also includes an RF generator to field verify that any of the aforementioned detector systems continue to function following some stressful event (e.g., the device is dropped onto a concrete floor). A piezoelectric spark generator creates a broadband RF spectrum which is applied to an antenna structure which radiates the signal with frequency response, directivity and polarization determined by the antenna structure. Generally, a piezoelectric spark generator is mounted in place of the RF probe that would normally launch RF signals from a coaxial transmission line into a rectangular waveguide. Use of an open rectangular waveguide provides a source for an efficient, directional, linearly polarized emission.

Still other desirable features of the present invention will become apparent to those of ordinary skill in the art upon reading and understanding the following detailed description, taken with the accompanying drawings, wherein like reference numerals represent like elements throughout.

DETAILED DESCRIPTION OF THE INVENTION

Figure 1:
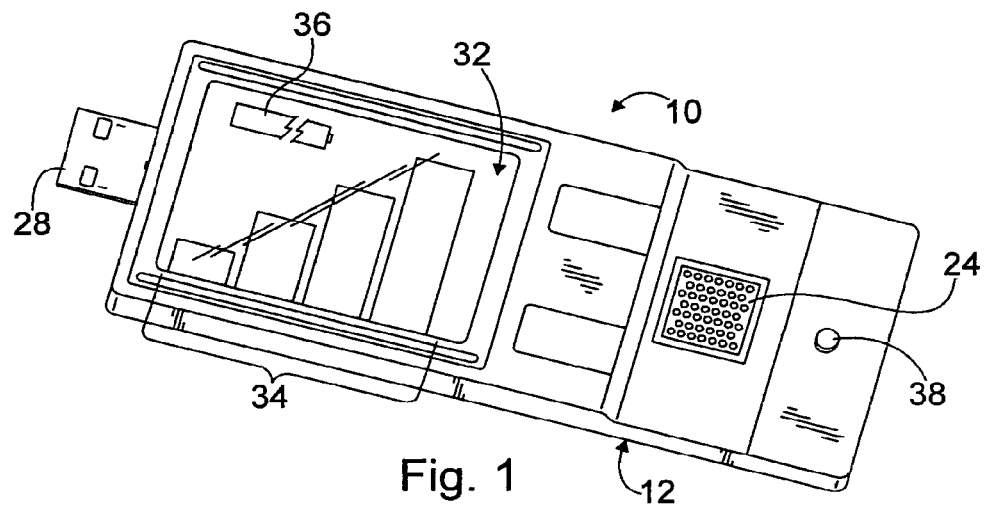
FIG. 1 is a top plan view of a device for detecting a transmission of electromagnetic radiation, in accordance with a first embodiment of the present invention.

For purposes of the description hereinafter, spatial or directional terms shall relate to the invention as it is oriented in the drawing figures. However, it is to be understood that the present invention may assume various alternative variations, except where expressly specified to the contrary. It is also to be understood that the specific apparatus illustrated in the attached drawings, and described in the following specification, is simply an exemplary embodiment of the invention. Hence, specific dimensions and other physical characteristics related to the embodiments disclosed herein are not to be considered as limiting, unless otherwise indicated. The present invention will now be described with reference to the accompanying figures.

Figure 2:
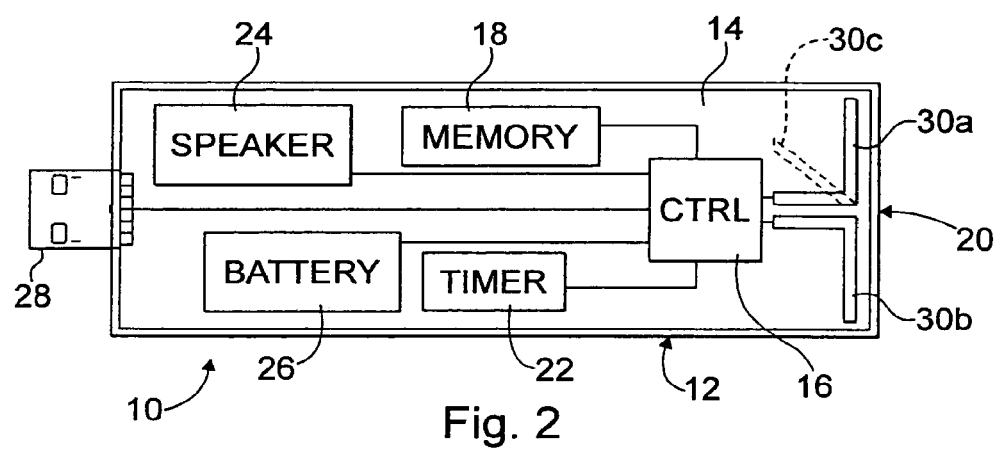
FIG. 2 is a schematic view of the components of the device of FIG. 1.

With reference to FIGS. 1 and 2, a device 10 for detecting a predefined RF transmission of electromagnetic radiation is shown. In a desirable embodiment, the device 10 includes a housing 12 having a circuit board 14 containing or connected to various components in communicative or electrical connectivity with each other. Generally, the housing 12 includes a controller 16, a memory 18, an antenna/detector 20, a timer 22, an audio-generating component 24, a battery 26, and a computer interface connector 28.

In the desirable embodiment, the device 10 is embodied as a stand-alone portable unit. The dimension and external appearance of the device 10 may be of any suitable type conducive to the functionality of the device 10. Specifically, the device 10 is sufficiently sized to accommodate the necessary hardware components. It is to be understood that other design criteria including, but not limited to, portability and aesthetics, may be considered in the construction of the device 10. In the desirable embodiment, the form-factor of the device 10 is conducive to wearing on a user's body, for example, either on a necklace as a pendant or on a keychain. Such a form-factor would not be unlike what is equivalent to a USB keychain flash memory drive. Securing mechanisms and fasteners, such as clips or Velcro®, may be integrated or attached to the housing 12 to facilitate securing or mounting of the device 10 on the user or an inanimate object. The housing 12 may be constructed of any suitable material including, but not limited to, plastic, metal, and a combination thereof. Additionally, the housing 12 may either be constructed of or coated with a resilient material, such as rubber, for shock absorption purposes and ruggedness. Furthermore, the device 10 may be electrically shielded. For example, all the components inside the housing 12 may be shielded except for the antenna/detector 20 and related detector elements. In any case, it is to be understood that the physical dimensions, structure, and aesthetics of the device 10 is not to be construed as limiting the invention.

The circuit board 14 is secured within the housing 12. The circuit board 14 may include various electrical components integrated therein or connected thereto via appropriate electrical connections. The controller 16 may be embodied as any suitable computing processor, such as a microprocessor. Appropriate software, such as firmware, is operative on the controller 16. Alternatively, or additionally to, the software may be stored within suitable storage mediums, such as the memory 18, within the device 10. However, it is to be understood that the software and any predefined, obtained, or calculated data may be stored in other mediums including, but not limited to, volatile/non-volatile RAM, flash memory, a hard disk drive, an optical drive, or other suitable storage mediums. The device 10 may or may not be programmable by the user.

As is known in the art, RF signals propagate through space having an electric field (E-field) component oriented perpendicular to the direction of propagation and a magnetic field (H-field) component oriented perpendicular to both the direction of propagation and the direction of the E-field component. This is referred to as transverse electromagnetic (TEM) wave propagation. The direction of the E-field component is known as the polarization of the TEM wave.

The antenna/detector 20 is connected to the controller 16 and is configured to receive an RF transmission. In the desirable embodiment, the antenna/detector 20 is constructed of first and second monopole antenna elements 30*a*, 30*b* integrated along a planar surface of the circuit board 14 such that the first and second monopole antenna elements 30; 30*b* are oriented in the same plane as each other. Desirably, each antenna element 30; 30*b* is substantially perpendicular to each other. Generally, the antenna elements 30; 30*b* each serve as monopole antennae working in conjunction with the low frequency section of the circuit board 14 and shield as a ground or counterpoise. Due to the orientation and shape of the antenna elements 30; 30*b*, the device 10 has significant sensitivity to detect signals arriving with the E-field oriented in any direction in the plane of the circuit board 14.

The need for multiple antenna elements can be illustrated as follows. A single monopole element working against a ground plane is most sensitive to EM waves having the E-field component parallel to the axis of the monopole. If the E-field polarization is orthogonal to the axis of the monopole element, the antenna is not sensitive to the passing EM waves. In order to provide sensitivity to EM waves of arbitrary polarization, multiple monopoles at various angles to each other are required. A preferred arrangement is to have three monopoles orthogonal to each other to guarantee significant sensitivity to EM waves of any possible polarization orientation.

As response of the device 10 to signals having E-field orientations perpendicular to the plane of the circuit board 14 is negligible, it is desirable to increase the detection sensitivity of the product to these signals. Accordingly, in an alternative embodiment of the present invention, a third monopole antenna element 30*c* (shown in phantom) may be arranged in substantially perpendicular relation to the first and second monopole antenna elements 30; 30*b*. This further antenna arrangement is conducive for receiving the E-field component of an RF transmission that is polarized perpendicular to the other two antenna elements such that the combined effect is to include sensitivity to any possible polarization orientation of incoming signals. It is to be understood that the form-factor of the device 10 may be modified accordingly to accommodate various possible arrangements of three antenna/detector elements, whereby the three antenna elements are approximately orthogonal to each other. For example, the device 10 may embody a square, sphere, or pyramid shape, which may be conducive for placement within a stationary environment, such as on a desktop or other surface. The antenna/detector 20 may either be an external or an internal antenna depending on the frequency response and sensitivity requirements of the device 10.

Generally, each antenna element drives the midpoint of a series connected pair of Schottky diodes (i.e., diode array) that are connected from a circuit ground to a detected output circuit point. The three diode-array outputs are connected together such that the highest detected voltage of the three sets of antenna/diode array sections is passed on to a comparator circuit, which may be embodied in the controller 16. The act of diode combining of multiple voltage sources such that the highest voltage source is passed on to a circuit load is an analog circuit design technique known as a diode-OR connection. The comparator threshold reference voltage is selectable from a number of discrete values. The detected voltage developed at the diode-OR point is related to the peak value of the E-field component of the electromagnetic wave incident on the antenna elements 30*a*, 30*b*, 30*c*.

The controller 16 via software (e.g., firmware) operative thereon, may be configured to sense the reception of various types of RF transmissions. The controller 16 is operative for sensing the peak magnitude (e.g., detected RF peak voltage) and other characteristics of modulated and unmodulated RF transmissions, such as RF pulse time duration and pulse repetition rate. Furthermore, the controller 16 is configured to identify a class of RF transmission based on the pulse duration and pulse repetition rate associated with the RF transmission. For example, such classes of RF transmission may include, but are not limited to, (a) continuous wave; (b) pulsed signals with repetition rates substantially on the order of milliseconds; (c) transient electromagnetic pulse signals with repetition rates substantially on the order of seconds (likely from TED threat sources); and (d) random transient electromagnetic pulse signals with no defined repetition rate (likely from lightning or other static discharge). The controller 16 may be further operative for establishing alarm threshold levels corresponding to ranges of detected magnitude of the RF transmission as selected by the operator. For example, each discrete threshold corresponds to a minimum level of magnitude that must be reached with respect to the received RF transmission. Subsequent thresholds are based on increasingly higher levels of magnitude than the preceding threshold. Accordingly, a predefined range of magnitude of the RF transmission corresponds to an area between two adjacent thresholds. The controller 16 may be configured to store data representative of an occurrence of any of the sensed classes of the RF transmissions in the memory 18 of the device 10. It is to be understood that statistical data may be computed and/or stored in the memory 18. For example, in addition to alarming via the computer interface connector 28, the number of "hits" recorded for signals exceeding the selected threshold may be stored for analysis. In the case of an RF event that is sufficient in magnitude to damage the host computer, the loss of USB port communication could be used to signal a failure of the computer to which the device 10 is connected. A timer/counter started at the time of host computer failure will increment to store the time elapsed since the failure in another enhancement of the invention. Relocation of the device 10 to another undamaged computer provides the user with the ability to download the elapsed time since the computer failure. Appropriate software may use the stored data to produce forensic information.

The audio-generating component 24, such as a speaker, is connected to the controller 16. The controller is operative for causing the audio-generating component 24 to output one or more tones having a predefined frequency, predefined duration, and/or predefined repetition associated with the class of the detected RF transmission. For example, a tone having a fixed duration of a first frequency may be generated by the audio-generating component 24 when a first threshold is reached. Thereafter, a tone having a fixed duration of a second frequency may be generated by the audio-generating component 24 when a second threshold is reached. In a further example, the device 10 may be configured to output a continuous tone as long as the transmission frequency is continually sensed or is maintained about a certain threshold. In yet another example, random short tones may be used to indicate static discharge events. Accordingly, the outputted tone or tones provide the user with aural discrimination of the class of the RF transmission received by the device 10. Specifically, the various tones allow the user to be aware of the relative magnitude, duration, and/or repetition of any RF transmissions sensed by the controller 16.

As shown in FIG. 1, the device 10 may include a display 32 integrated into the housing 12 of the device 10. The display 32 may be an LCD, LED, or other suitable display. The display 32 is connected to the controller 16 such that the display 32 is operative for displaying visual indicia 34 corresponding to each of the various threshold levels. For example, the visual indicia 34 may be a bar that may assume various heights, not unlike a signal strength indicator on a mobile phone. Alternatively, the display 32 may be a series of LEDs that are operated by the controller 16 such that a corresponding lit pattern represents the various threshold levels. The display 32 may also be configured to display specific quantitative data, such as the actual magnitude, pulse duration, and/or pulse repetition rate of any RF transmission sensed by the controller 16. Furthermore, the display 32 may be configured to display a battery strength indicator 36. It is to be understood that various other visual indicia, such as time and date, for example, may be depicted on the display 32. The visual indicia 34 may be displayed contemporaneously with the sounding of the tones. Alternatively, only the visual indicia 34 or only the tones may be used for alert purposes by the device 10.

The device 10 may include a series of comparators (for RF signal detected magnitude) to drive a bar graph via a switch-selectable alarm threshold level. Exceeding the selected threshold would trigger a monostable (i.e., one shot) to drive a short audible alarm. The user would still be able to discriminate between at least two classes of detected signal via audible alarm as follows. If the detected signal is continuous wave or pulsed signal of rapid repetition rate, the monostable would be continuously re-triggered so that the alarm tone is constant as long as the detected signal exceeds the selected magnitude threshold more often than the duration of the (short) alarm tone. For either TED, lightning or static discharge signals, the short tone would be output. For TED signals of relatively long repetition rate (occurrences spaced farther apart in time than the (short) alarm tone duration which may be on the order of a tenth of a second), individual short alarm tones would be output for each repetitive signal "hit". In the case of lightning/static discharge, the short alarm tone may be outputted but would exhibit a random instead of a regularly repeating occurrence.

The device 10 may include one or more actuators 38, such as buttons, integrated into the housing 12 of the device 10 which are connected to the controller 16. The controller 16 is operative to output the visual and/or aural alert indicative of the occurrence of one or more classes of RF transmissions having been sensed at one or more of the various threshold levels. In the desirable embodiment, the device 10 is configured to operate in real-time. Accordingly, it may be the case that the user is not in the presence of the device 10 when one of the classes of RF transmissions is sensed. Therefore, upon returning within the presence of the device 10, the user will not necessarily be aware that a class of RF transmissions has been sensed, as the aural alert was initiated when the user was not in the presence of the device 10. By having the user depress the actuator 38, the controller 16 may repeat the previous alert or series of past alerts.

The computer interface connector 28 allows for communicative connectivity between the device 10 and a computer (not shown). The computer interface connector 28 is connected to the controller 16. Desirably, the computer interface connector 28 is a male USB connector configured to be received in a counterpart (e.g., female) USB port. However, it is to be understood that the computer interface connector 28 may be any other suitable connector that allows the device 10 to be connected to the computer. For example, the device 10 may include an integrated female miniature USB cable interface that requires the device 10 to be connected via a cable to the computer. The computer interface connector 28 provides additional functionality to the device 10 including, but not limited to, providing additional power, logging/offloading events, and communicating via an existing network.

Appropriate software, proprietary or otherwise, may be used to interface with the device 10 after it has been connected to the computer. For example, software operative on the computer may be used to retrieve data relating to occurrences of sensed RF transmissions. The computer interface connector 28 may also be used to pass programming instructions (e.g., firmware updates) to the device 10. The device 10 may be configured to suppress any audible and/or visual alerts when connected to the computer. The software may also be configured to receive data representative of the audible and/or visual alerts and display such alerts on a local computer screen. Alternatively, the alerts and/or related data may be transmitted to and/or displayed on remote computers via a distributed computer network (e.g., LAN, Internet). For example, the alerts and data may be transmitted to a central monitoring station for recordation and further investigation.

Use of the device 10 in connection with a localized network provides the ability to discriminate localized static discharge from actual RF signals. Generally, a number of the devices 10 are deployed throughout a given facility with the appropriate software loaded on their respective computers to provide network-wide reporting to a central monitoring station. Local static discharge events will trigger alerts only in the immediate vicinity of a given device 10, whereas actual RF threats will be sensed by more than one device 10. Therefore, if a number of devices 10 across a wide area of deployment sense the RF transmission, there is a greater certainty that an RF attack has occurred, as opposed to simply a localized static discharge. Additionally, knowledge of the reported signal levels from widely dispersed detectors may be used to identify the relative location of or direction to a responsible RF emitter. For example, use of the devices 10 in a network context provides the ability to utilize triangulation techniques based upon the relative magnitude and direction of sensed RF transmissions to the various devices 10 to pinpoint a more accurate location of the RF emitter.

The controller 16 is operative for starting the timer 22 when the controller 16 detects that an electrical current received from a computer via the computer interface connector 28 has ceased. Specifically, this may indicate computer failure due to an RF attack. An incrementing counter value is created by the timer 22 with the increasing amount of time that has passed since the computer failure. An investigation of the RF attack would involve reading the present counter value and subtracting that value from the current time to yield the approximate time that the computer was attacked.

The computer interface connector 28 may be used for purposes of providing power to the device 10. For example, the battery 26 may be a rechargeable battery electrically connected to the computer interface connector 28. The controller 16 may be configured to charge the battery 26 from electricity received from the computer via the computer interface connector 28 when the device 10 is connected to the computer. By drawing power from the computer, the device 10 may emit a more powerful alert tone and provide a brighter or higher contrast display than if the device 10 were used as a purely portable unit (e.g., pendant). In a desirable embodiment, the device 10 is in an always-on state as very little power is required for purposes of detection. The device 10 may be easily recharged by plugging in the device 10 into any ubiquitous USB port found on most modern computers, desktop, laptop, or otherwise.

By utilizing a larger sized device 10 with power drawn via the computer interface connector 28, the device 10 facilitates measurement of a relatively continuous range of detected signals. A high impedance buffer amplifier following the diode-OR connection of the detector diodes, in conjunction with appropriate shunt resistance and capacitance, can be configured to provide a detector having fast attack or rise time (e.g., on the order of tens to hundreds of nanoseconds) and slow decay time (e.g., on the order of tens of milliseconds). The output of this stage is suitable to drive a relatively slow analog-to-digital (A/D) converter stage. The A/D output may be polled faster than the previous stage decay rate (with data logging and alarms output) when detected signals exceed a predetermined threshold.

Dynamic range is the range between the smallest and the largest detectable signal. The dynamic range of the basic diode detector/diode-OR circuit may be extended by adding a temperature-compensated bias circuit for the detector diodes in the buffer amplifier stage to enable detection of lower-level signals than is possible with a non-biased diode detector. The buffer amplifier may be followed with an amplifier having logarithmic response (log-amp) prior to an A/D converter. Alternatively, a series of comparators may be employed having a series of thresholds that are incremented on a logarithmic basis to establish the threshold levels.

Figure 3:
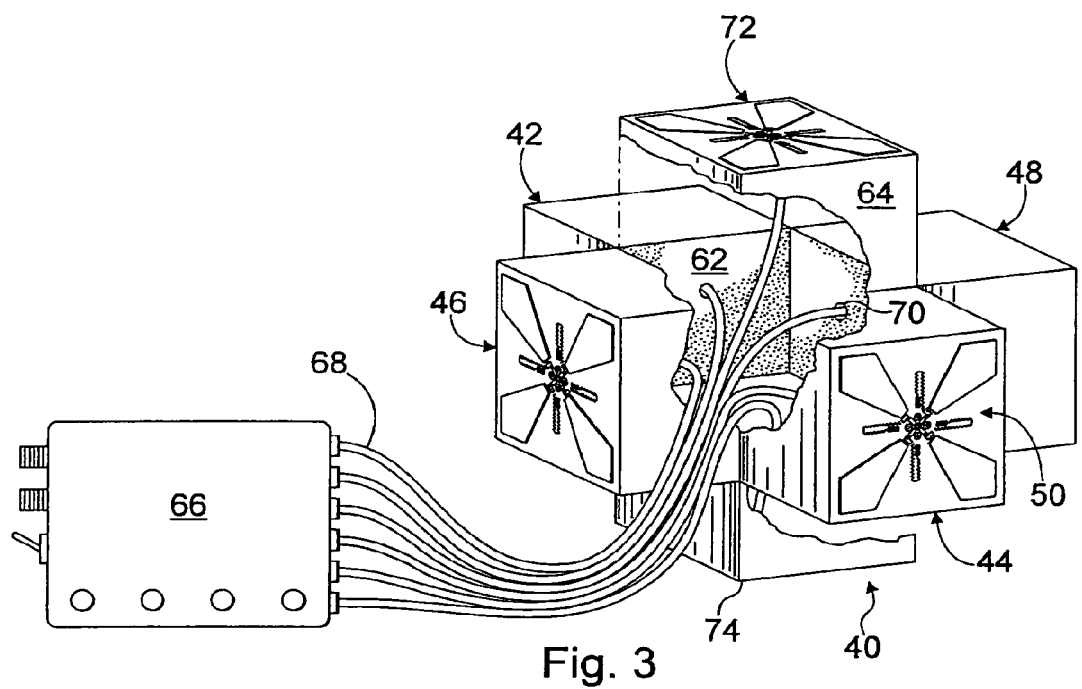
FIG. 3 is a perspective cutaway view of a device for detecting transmission of electromagnetic radiation, in accordance with a second embodiment of the present invention.
Figure 4:
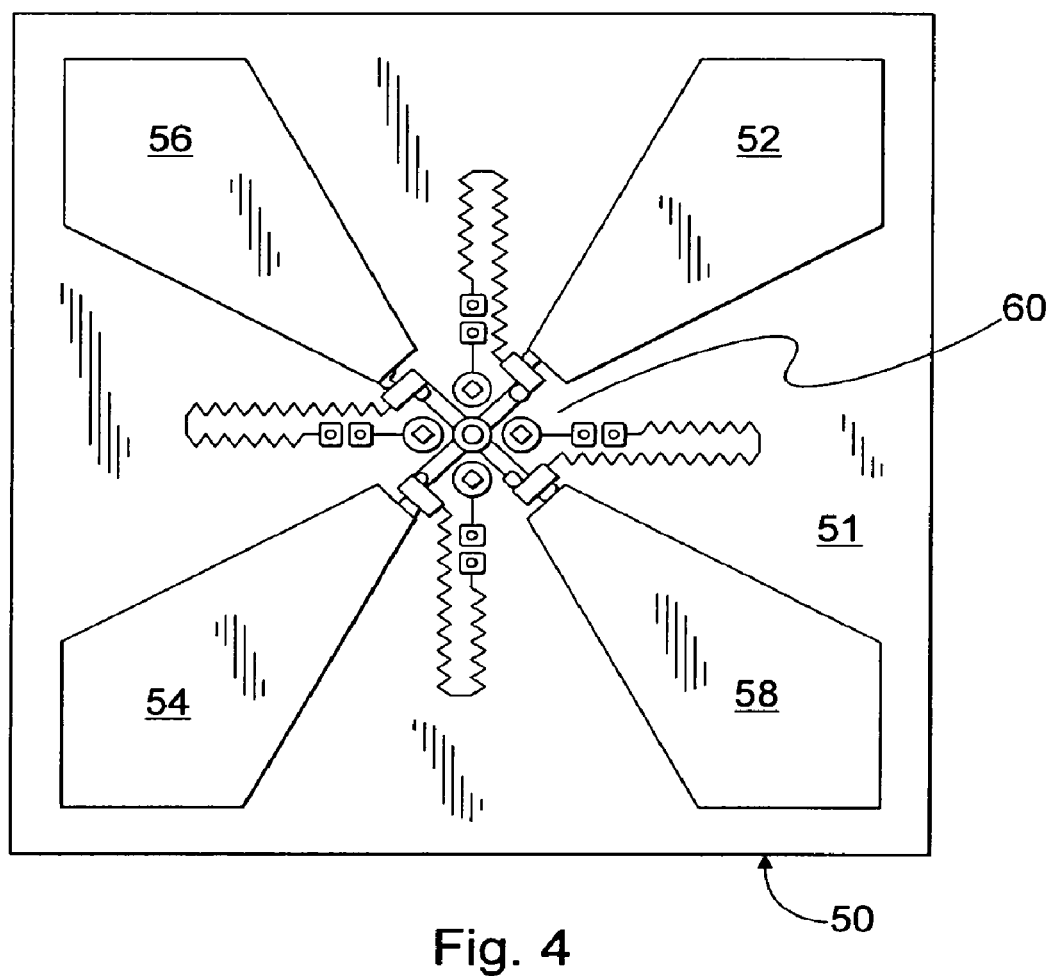
FIG. 4 is a front plan view of an antenna element configuration of the device of FIG. 3.

With reference to FIGS. 3-4, a device 40 for detecting a predefined RF transmission of electromagnetic radiation, according to an alternative embodiment, is shown. The device 40 has multiple sector antenna/detector unit pattern responses which overlap the responses of adjoining antenna/detector units slightly to facilitate a response over a full 360 degrees of azimuth bearing to an emitter of the electromagnetic radiation transmission. Generally, the device 40 is a directional-sensing wideband frequency antenna/detector array including a first sector antenna/detector unit 42 and a second sector antenna/detector unit 44, each centrally situated along a first axis in a first plane. A third sector antenna/detector unit 46 and a fourth sector antenna/detector unit 48 are centrally situated along a second axis substantially perpendicular to the first axis in the first plane, wherein, desirably, a point of intersection of the first and second axis is substantially equidistant from each of the detector units 42, 44, 46, 48. Each side of the first, second, third, and fourth sector antenna/detector units 42, 44, 46, 48 facing away from the point of intersection includes an antenna/detector element configuration 50 situated thereon. Generally, the antenna/detector element configuration 50 is embodied in a circuit board 51. Each antenna/detector element configuration 50 includes a first, second, third, and fourth monopole element 52, 54, 56, 58, wherein the first and second monopole elements 52, 54 are situated substantially perpendicular to the third and fourth monopole elements 56, 58 in substantially a same plane. Each combination of three monopoles/detectors serves as the counterpoise for the remaining monopole. A distal portion of each of the first, second, third, and fourth monopole elements 52, 54, 56, 58 may be of various shapes. Exemplary shapes include triangular, bow-tie, half bow-tie, and elliptical, however, it is to be understood that the monopole elements may be any suitable shape conducive for a wideband response. Each monopole antenna element configuration 50 includes respective detectors 60. Detectors 60 are connected in a diode-OR configuration such that the highest level detected by any of the monopole elements 52, 54, 56, 58 is passed on to the processing circuits from their sector antenna/detector unit. This combination of monopole/detector elements provides detection sensitivity to TEM waves of any polarization orientation arriving approximately normal (+/− about 45 degrees) to the plane of the circuit board 51. An alternative configuration of three monopole/detector elements oriented at approximately 120 and 240 degrees to each other in the plane of their common circuit board 51 can also provide detection sensitivity to TEM waves of arbitrary polarization orientation arriving approximately normal to their common plane.

Additionally, an absorber material 62 is situated behind each antenna element configuration 50 to absorb a predefined range of electromagnetic radiation. Generally, the absorbing material is placed on the null side of the antenna/detector element configuration 50 to achieve some directional properties. In a desirable embodiment, the absorber material 62 is constructed of polyurethane foam or other suitable matrix material having RF attenuating material (e.g., carbon) distributed throughout. For example, the absorber material 62 may include layers of open-cell polyurethane foam functioning as a matrix. The RF attenuating material serves as a distributed resistor which attenuates RF signals passing through it. It is to be understood that any other suitable RF attenuating material may be used. The four monopole elements 52, 54, 56, 58 on the printed circuit board 51 have maximum antenna pattern response in both directions perpendicular to the plane of the circuit board 51. Each respective antenna/detector element configuration 50 achieves directional properties by shielding, via a metallic shield 64, and absorbing, via the absorber material 62, the antenna response in the direction toward the center of the entire array (of sector antenna/detector units) while leaving the response looking out substantially unaffected. The distance of metallic coverage up the sides of the absorber material 62 is selected to adjust the sector beamwidth to approximately 90 degrees. The shielding may be of any suitable material, including metalized plastic. The absorber material 62 is designed to be placed against a metallic backing to reduce the reflection of RF signals from a metal wall. RF absorption properties of the absorber material 62 are based upon the thickness of the absorber material 62. Generally, thicker material works down to lower frequencies. Exemplary absorber material 62 may be AEL-2.25 (i.e., 2.25 inch thickness) distributed by Advanced ElectroMagnetics, Inc. of Santee, Calif.

The rear or null side of the absorber material 62 is covered with metal to enhance the directional properties. The metal is continued up the sides of the absorber to increase the directional properties. The metal coverage on the sides of the absorber is cut back from the plane of the monopole elements 52, 54, 56, 58, as necessary to achieve the desired overlapping response between adjoining sector antenna/detector units 42, 44, 46, 48.

In the desired embodiment, the device 40 may also include a controller 66 operative for receiving the respective signal from each of the first, second, third, and fourth sector antenna/detector units 42, 44, 46, 48. The controller 66 is also operative for summing the signals received from the first and second sector antenna/detector units 42, 44 to obtain a first vector sum and summing the signals received from the third and fourth sector antenna/detector units 46, 48 to obtain a second vector sum. The controller 66 is further operative for summing the first and second vector sums to obtain a net bearing of an emission source of the electromagnetic radiation transmission. Similar to the controller 16 of the device 10, the controller 66 may also be operative for determining a magnitude, a pulse duration, and a repetition rate associated with the electromagnetic radiation transmission.

In the desirable embodiment, the output of each of the four antenna element/detector outputs corresponding to the respective monopole elements 52, 54, 56, 58 are joined in diode-OR fashion. The diode-OR detector combining occurs in the vicinity of the four monopole elements 52, 54, 56, 58. A coaxial cable 68 exits the diode-OR common point via a hole 70 in the absorber material 62 and a rear portion of the metallic shield 64 in the null direction of each of the detector units 42, 44, 46, 48. The coaxial cable 68 passes through a ferrite bead to provide a Balun Effect to minimize undesired RF signal currents on the coaxial cable 68. The coaxial cable 68 from each of the detector units 42, 44, 46, 48 is connected to buffer stages, vectorially added in opposite pairs, and, optionally, passed to a log-amp prior to final vector summing.

In a further embodiment of the device 40, a fifth sector antenna/detector unit 72 is centrally situated along a third axis in a second plane, wherein the third axis is perpendicular to the first and second axis and intersects the first and second axis at the point of intersection of the first and second axis. As is the case with the first, second, third, and fourth detector units 42, 44, 46, 48, the point of intersection of the first and second axis is substantially equidistant from fifth detector unit 72 as well. This fifth detector unit 72 facing upwards extends the direction finding functionality into a three-dimensional context. Accordingly, a directional-sensing wideband frequency antenna array having this arrangement may be used to detect or track airborne emitters from locations on the ground, for example. In an exemplary embodiment, this further embodiment of the device 40 may be incorporated into a vehicle such that the first, second, third, fourth, and fifth detector units 42, 44, 46, 48, 72 are associated with a front, back, left, right, and top side, respectively, of the vehicle.

In still a further embodiment of the device 40, a sixth detector unit 74 is centrally situated along the third axis in the second plane. As is the case with the first, second, third, and fourth detector units 42, 44, 46, 48, the point of intersection of the first and second axis is substantially equidistant from the sixth detector unit as well. Accordingly, a directional-sensing wideband frequency antenna array having this arrangement provides three-dimensional detection or tracking capabilities from an aircraft, for example.

It is to be understood that the device 40 may assume any suitable physical dimension, structure, and aesthetic quality for its intended purpose. For example, the device 40 may be sufficiently miniaturized for helmet mounting applications yet offer similar functionality as would a larger sized device 40. Furthermore, it is to be understood that the components and functionality discussed in connection with the device 10 may also be incorporated into the device 40. For example, the device 40 may also include a computer interface connector (or direct wired/wireless connection) and similar network awareness and reporting functionality.

Figure 5:
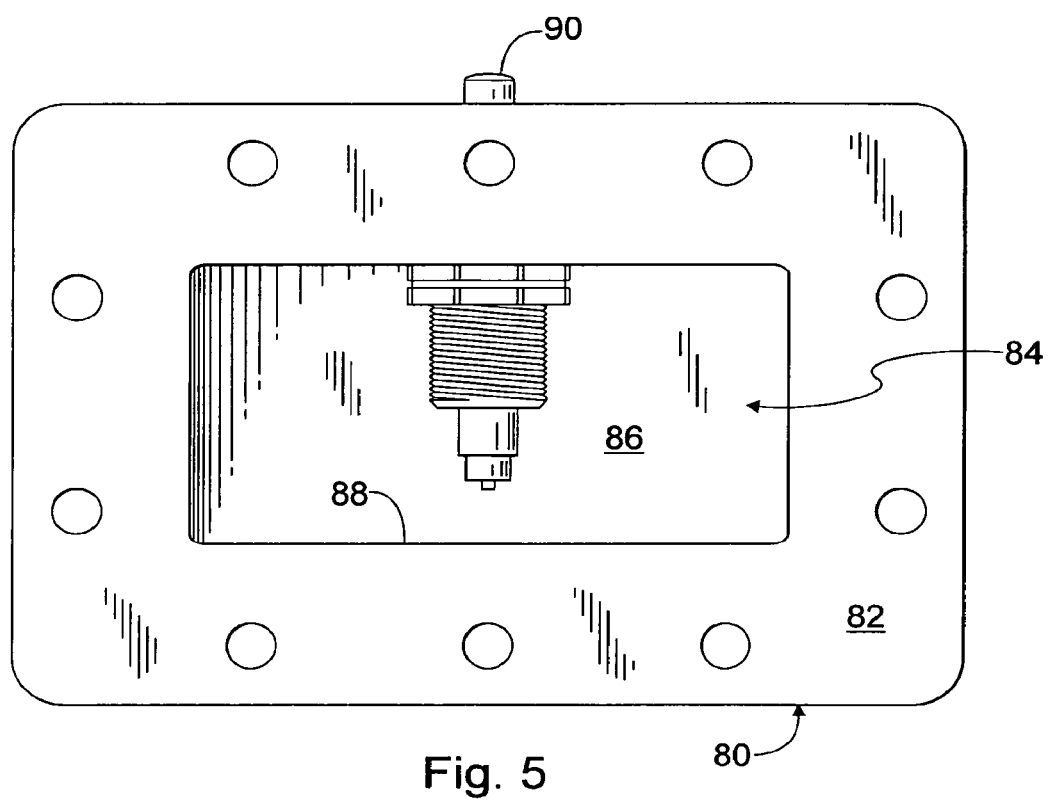
FIG. 5 is a front plan view of a device for generating and radiating a wideband RF impulse signal in a defined electric field polarization.

With reference to FIG. 5, the present invention also includes a device 80 for generating a wideband RF pulse signal in a directed electric field polarization. In an exemplary embodiment, the device 80 includes a housing 82 having an opening and cavity 84 defined therein. Desirably, the cavity 84 is rectangular in shape, however, it is to be understood that any suitable shape or dimension may be used. A spark generator or high voltage pulse generator 86, such as one constructed of piezoelectric material having a hammer element for striking the piezoelectric material, is disposed within the cavity 84. A distal end of the high voltage pulse generator 86 is positioned in spaced relation to an interior portion 88 of the housing 82 such that a spark gap is established between the high voltage pulse generator 86 and the housing 82. The spark gap location is selected to be the approximate location where a probe could be used to couple an RF signal from a coaxial cable 68 to the housing 82 to serve as an antenna to launch the RF signal into space in a particular polarization orientation, beam-width and frequency response. The step change in voltage in the gap during breakdown of the air or other dielectric fluid generates a wide band of spectral components. The size and shape of the antenna determine the relative magnitudes of the available spectral components that are radiated (antenna frequency response). This concept applies generally to any type of antenna which is not inherently short circuit connected across its terminals (i.e., the antenna feedpoint). The piezoelectric high voltage pulse generator 86 may be located near the antenna terminals with the spark gap located at the antenna terminals. An actuator 90 in communication with the high voltage pulse generator 86 is configured to cause the high voltage generator 86 to generate the pulse when the actuator 90 is operated upon by an external force. The resultant wideband RF pulse can be used for signaling purposes as part of a larger electronic system or used as a test source for devices, such as devices 10 and 40, discussed above.

The high voltage pulse generator 86 may operate fully under manual operation or may include electronic components for rapid and consistent RF emission generation. For example, the high voltage pulse generator 86 may include a battery and a solenoid, wherein the solenoid when having a current pass therethrough causes the hammer element to strike the piezoelectric material.

The processing electronics of an HPM detector need to be shielded from the electromagnetic environment to avoid disruption or damage by large EM signals. An example shield could be a metallic enclosure or a non-metallic structure with a metallic coating. The shielded enclosure also serves as a ground plane structure for the monopole antenna elements. However, an undesired effect related to the antenna is that the shielding enclosure also serves to substantially reduce antenna sensitivity to EM signals arriving on the opposite side of the enclosure from the antenna array.

Figure 6:
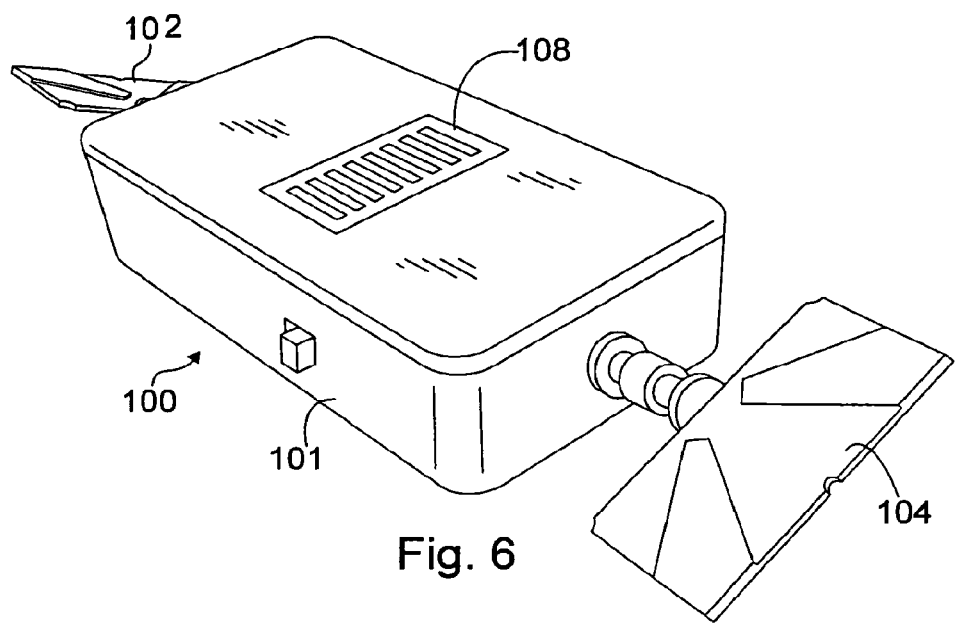
FIG. 6 is a perspective view of a first alternative embodiment of the device of FIG. 1.

To this end, the present invention includes a first alternative embodiment 100 of the device 10, as shown in FIG. 6. To overcome the shielding of desired signals by an enclosure 101, the device 100 incorporates a first antenna/detector array 102 on one side of the enclosure 101 and incorporates a second antenna/detector array 104 on the opposite side of the enclosure 101. Generally, two monopole antennas/detectors are oriented approximately perpendicular to each other in a planar arrangement. This arrangement may be implemented in the form of a PCB having an edge-mounted coaxial connector for both mechanical connection and delivery of the detected signal to the enclosure containing the processing electronics. Desirably, each monopole element is oriented at approximately 45 degrees to either side of the axis of the coaxial connector and in the plane of the PCB. By rotating the mounting orientation of the two antenna board planes to be approximately perpendicular to each other, sensitivity to EM signals of nearly all orientations may be achieved. In this arrangement, respective high impedance amplifiers receive the envelope detected signals from the first and second antenna/detector arrays 102, 104. The two amplifier outputs may be combined using diodes to pass on the highest detected signal from the two antenna/detector arrays 102, 104 for further processing.

Figure 7:
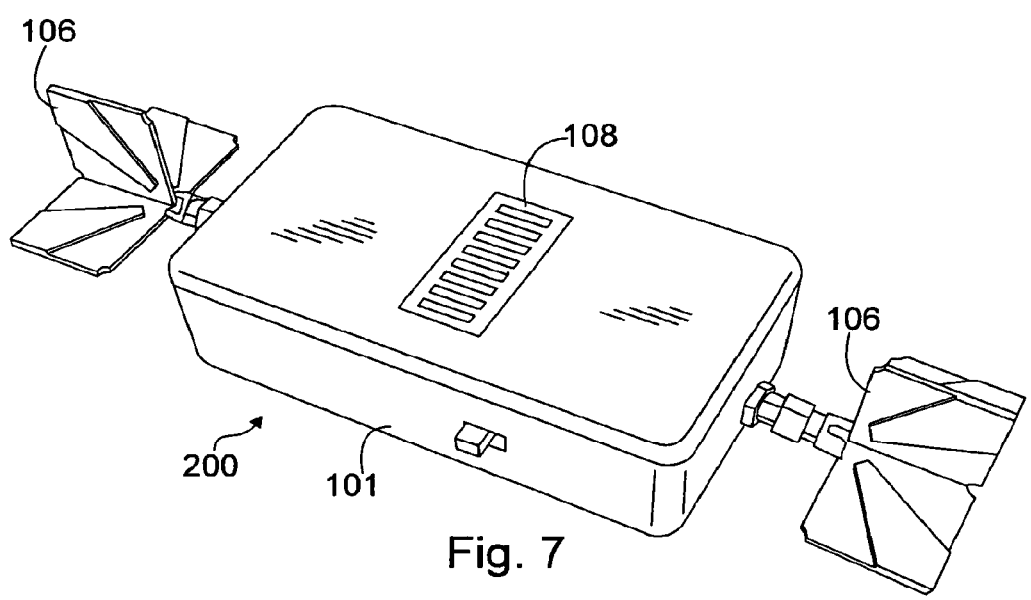
FIG. 7 is a perspective view of a second alternative embodiment of the device of FIG. 1.

It may be possible that poor sensitivity is displayed over only a relatively small range of possible EM signal orientations. This poor sensitivity case is primarily when the EM wave is originating from a direction that is shielded by the electronic enclosure from one of the two antennae and simultaneously has E-field orientation approximately orthogonal to the plane of the remaining (unshielded) antenna board. The small range of insensitive orientations in the above example may be eliminated by the addition of another monopole element to each of the antenna/detector units. As shown in FIG. 7, the two monopole antenna/detector boards may be enhanced by the addition of a third monopole. Specifically, the device 100 of FIG. 6 may be modified such that the first and/or second antenna/detector arrays 102, 104 include a respective perpendicularly arranged third antenna element 106. Such an exemplary second alternative embodiment device 200 is shown in FIG. 7. The third antenna element 106 is another monopole that may be constructed on an additional PCB mounted perpendicularly to the board that includes the original two monopoles of the first and second antenna/detector arrays 102, 104. The third antenna element 106 may also be oriented at approximately 45 degrees from the axis of the coaxial connector, resulting in an orthogonal relationship between the three, antenna/detector arrays 102, 104, 106. In any case, the aforementioned antenna arrangements are sensitive to any possible polarization orientation of an incoming signal. It is to be understood that the devices 100, 200 may include similar components and functionality as the device 10. For example, devices 100, 200 may include a display 108 for displaying visual indicia corresponding to each of the various threshold levels detected by the devices 100, 200.

Commonly encountered electromagnetic environments typically include relatively high electric field levels of low frequency sources, such as power lines, lamp dimmers, switch mode power supplies, etc. While the aforementioned antenna elements are relatively insensitive to signals at these frequencies due to the small antenna size relative to the wavelengths of these frequencies, the existence of large low-frequency E-fields may cause false positive indications (of HPM threat signals).

Therefore, the present invention may include the use of a high-pass filter addition to each antenna/detector element. For example, a circuit for 'implementing the high-pass filter may include a shunt inductor connecting a monopole antenna element to ground and a capacitor connected between the antenna element and the common node of the diode pair of the envelope detector. This arrangement serves to reduce sensitivity to low frequency signals while not reducing sensitivity to high frequency signals.

Some expected threat sources exhibit very short pulse durations which are difficult to detect using simple inexpensive signal-processing techniques. The present invention may provide indication of the envelope of the detected threat signal. If the shunt capacitor following the detector diodes is made very small, it may be charged to approach the peak signal value in a very short time so that the circuit is sensitive to very short pulse durations. By the addition of one or more cascaded pulse-stretching circuits, the duration of the detected pulse can be extended to enable use of simple inexpensive signal-processing circuits following the pulse-stretching function. An example of one type of pulse-stretching circuit is to employ a relatively low impedance amplifier to drive a charge through a series signal diode into a shunt capacitor connected to signal ground. The shunt capacitor is also shunted by a high value resistor. The signal voltage at the shunt capacitor is applied to the input of a high input impedance amplifier. The amplified signal output is available for further signal processing. The charging time constant of the capacitor is limited by the dynamic impedance of the signal diode, while the discharge time constant may be orders of magnitude longer as determined by the shunt resistor. Practical examples of cascaded pulse-stretch circuits may lengthen the detected signal envelope pulse from tens of nanoseconds to milliseconds in duration. The millisecond pulse duration may be long enough to accommodate the use of relatively slow, inexpensive signal-processing circuits.

The invention has been described with reference to the desirable embodiments. Modifications and alterations may occur to others upon reading and understanding the preceding detailed description. It is intended that the invention be construed as including all such modifications and alterations insofar as they come within the scope of the appended claims or the equivalents thereof.

What is claimed is:

1. A directional-sensing electromagnetic radiation detection device comprising:
    a plurality of sector antenna/detector units, each of said sector antenna/detector units comprising:
        a directional antenna element having a beam-width of approximately 90 degrees, and
        an envelope detector structured to detect electromagnetic radiation signals,
        wherein a first sector antenna/detector unit and a second sector antenna/detector unit of said sector antenna/detector units are situated along a first axis in substantially a same plane,
        wherein a maximum sensitivity direction of each of said first and second sector antenna/detector units points away from each other along the first axis,
        wherein a third sector antenna/detector unit and a fourth sector antenna/detector unit of said sector antenna/detector units are situated along a second axis in substantially said same plane,
        wherein a maximum sensitivity direction of each of said third and fourth sector antenna/detector units points away from each other along the second axis, and
        wherein the second axis is substantially perpendicular to the first axis; and
    a controller structured to receive the detected electromagnetic radiation signals from each of the first, second, third and fourth sector antenna/detector units, sum the received detected electromagnetic radiation signals from the first and second sector antenna/detector units to obtain a first vector sum, sum the received detected electromagnetic radiation signals from the third and fourth sector antenna/detector units to obtain a second vector sum, and sum the first and second vector sums to obtain a net azimuth bearing of an emission source of the electromagnetic radiation signals.

2. The device of claim 1 wherein the electromagnetic radiation is a radio frequency signal or a transient electromagnetic pulse signal from a transient electromagnetic device (TED) threat source.

3. The device of claim 2 wherein the first, second, third and fourth sector antenna/detector units are sensitive to the radio frequency signal or the transient electromagnetic pulse signal having a wide band of frequency spectral components and are further sensitive to said signals arriving incident approximately to the maximum sensitivity direction of each of the first, second, third and fourth sector antenna/detector units at arbitrary polarization orientations.

4. The device of claim 1 wherein each of the first, second, third and fourth sector antenna/detector units comprises a printed circuit board including a square outline having a center and four corners on a plane and further including as the directional antenna element four monopole antenna elements, each of the four monopole antenna elements having a substantially triangular shape with a first portion and a distal second portion, the substantially triangular shape extending between the center of the printed circuit board and one of the four corners of the printed circuit board, the distal second portion having one of a triangular shape and bow-tie shape; wherein each of the four monopole antenna elements includes a signal diode radio frequency envelope detector placed between the first portion and the center of the printed circuit board; wherein the signal diode radio frequency envelope detector of each of the four monopole antenna elements is electrically connected in a diode-OR configuration of the printed circuit board in order that a highest level detected by any of the four monopole antenna elements is passed to the controller from a corresponding one of the first, second, third and fourth sector antenna/detector units; and wherein a normal to the plane of the printed circuit board is co-linear with one of the first axis and the second axis of the corresponding one of the first, second, third and fourth sector antenna/detector units.

5. The device of claim 4 wherein a minimum sensitivity direction points away from the maximum sensitivity direction of each of said first and second sector antenna/detector units; wherein a minimum sensitivity direction points away from the maximum sensitivity direction of each of said third and fourth sector antenna/detector units; and wherein each of said first, second, third and fourth sector antenna/detector units comprises radio frequency absorbing material operable to attenuate signals arriving from the minimum sensitivity direction.

6. The device of claim 5 wherein each of said first, second, third and fourth sector antenna/detector units further comprises a plurality of sides and a metallic shield substantially surrounding the radio frequency absorbing material; wherein one of said sides has the printed circuit board disposed thereon; and wherein said metallic shield substantially encases each of said sides other than said one of said sides having the printed circuit board disposed thereon.

7. The device of claim 6 wherein said metallic shield further attenuates signals arriving from the minimum sensitivity direction to enhance directional-sensing of said device.

8. The device of claim 1 wherein a minimum sensitivity direction points away from the maximum sensitivity direction of each of said first and second sector antenna/detector units; wherein a minimum sensitivity direction points away from the maximum sensitivity direction of each of said third and fourth sector antenna/detector units; and wherein each of said first, second, third and fourth sector antenna/detector units comprises radio frequency absorbing material operable to attenuate signals arriving from the minimum sensitivity direction.

9. The device of claim 8 wherein the radio frequency absorbing material is structured to absorb a predefined range of the electromagnetic radiation.

10. The device of claim 8, wherein the radio frequency absorbing material is a radio frequency attenuating material.

11. The device of claim 1 wherein the controller is further structured to obtain a relative magnitude of the emission source of the electromagnetic radiation signals.

12. The device of claim 1 wherein each of the first, second, third and fourth sector antenna/detector units includes a first, second, third and fourth monopole element; and wherein the first and second monopole elements are situated substantially perpendicular to the third and fourth monopole elements in substantially a same plane.

13. The device of claim 1 wherein each of the first, second, third and fourth sector antenna/detector units includes a first, second and third monopole element; and wherein the first monopole element is situated in substantially 120 degree relation to the second monopole element and the second monopole element is situated in substantially 120 degree relation to the third monopole element in substantially a same plane.

14. The device of claim 1, wherein a point of intersection of the first axis and the second axis is substantially equidistant from the first, second, third, and fourth sector antenna/detector units.

15. The device of claim 1, wherein a predefined range of the electromagnetic radiation is between 100 MHz and 10 GHz.

16. The device of claim 1, wherein the electromagnetic radiation transmission is harmful to an electrical device.

17. The device of claim 16, wherein the electromagnetic radiation harmful to the electrical device is selected to disrupt or damage the electrical device.

18. A directional-sensing electromagnetic radiation detection device comprising:
    a plurality of sector antenna/detector units, each of said sector antenna/detector units comprising:
        a directional antenna element having a beam-width of approximately 90 degrees, and
        an envelope detector structured to detect electromagnetic radiation signals,
        wherein a first sector antenna/detector unit and a second sector antenna/detector unit of said sector antenna/detector units are situated along a first axis in substantially a same first plane,
        wherein a maximum sensitivity direction of each of said first and second sector antenna/detector units points away from each other along the first axis,
        wherein a third sector antenna/detector unit and a fourth sector antenna/detector unit of said sector antenna/detector units are situated along a second axis in substantially said same first plane,
        wherein a maximum sensitivity direction of each of said third and fourth sector antenna/detector units points away from each other along the second axis,
        wherein the second axis is substantially perpendicular to the first axis,
        wherein a fifth sector antenna/detector unit of said sector antenna/detector units is situated along a third axis in a second plane different from said same first plane,
        wherein the third axis is substantially perpendicular to the first axis and the second axis,
        wherein the third axis intersects the first axis and the second axis at a point of intersection of the first axis and the second axis,
        wherein the point of intersection is substantially equidistant from the first, second, third, fourth and fifth sector antenna/detector units; and
    a controller structured to receive the detected electromagnetic radiation signals from each of the first, second, third, fourth and fifth sector antenna/detector units, sum the received detected electromagnetic radiation signals from the first and second sector antenna/detector units to obtain a first vector sum, sum the received detected electromagnetic radiation signals from the third and fourth sector antenna/detector units to obtain a second vector sum, and sum the first and second vector sums and the received detected electromagnetic radiation signal from the fifth sector antenna/detector unit as a vector to obtain a net azimuth bearing and an elevation bearing of an emission source of the electromagnetic radiation signals.

19. The device of claim 18 wherein the controller is further structured to obtain a relative magnitude of the emission source of the electromagnetic radiation signals.

20. A directional-sensing electromagnetic radiation detection device comprising:
- a plurality of sector antenna/detector units, each of said sector antenna/detector units comprising:
  - a directional antenna element having a beam-width of approximately 90 degrees, and
  - an envelope detector structured to detect electromagnetic radiation signals,
  - wherein a first sector antenna/detector unit and a second sector antenna/detector unit of said sector antenna/detector units are situated along a first axis in substantially a same first plane,
  - wherein a maximum sensitivity direction of each of said first and second sector antenna/detector units points away from each other along the first axis,
  - wherein a third sector antenna/detector unit and a fourth sector antenna/detector unit of said sector antenna/detector units are situated along a second axis in substantially said same first plane,
  - wherein a maximum sensitivity direction of each of said third and fourth sector antenna/detector units points away from each other along the second axis,
  - wherein the second axis is substantially perpendicular to the first axis,
  - wherein a fifth sector antenna/detector unit of said sector antenna/detector units is situated along a third axis in a second plane different from said same first plane,
  - wherein a sixth sector antenna/detector unit of said sector antenna/detector units is situated along the third axis in the second plane,
  - wherein the third axis is substantially perpendicular to the first axis and the second axis,
  - wherein the third axis intersects the first axis and the second axis at a point of intersection of the first axis and the second axis,
  - wherein the point of intersection is substantially equidistant from the first, second, third, fourth, fifth and sixth sector antenna/detector units, and
  - wherein a maximum sensitivity direction of each of said fifth and sixth sector antenna/detector units points away from each other along the third axis; and
- a controller structured to receive the detected electromagnetic radiation signals from each of the first, second, third, fourth, fifth and sixth sector antenna/detector units, sum the received detected electromagnetic radiation signals from the first and second sector antenna/detector units to obtain a first vector sum, sum the received detected electromagnetic radiation signals from the third and fourth sector antenna/detector units to obtain a second vector sum, sum the received detected electromagnetic radiation signals from the fifth and sixth sector antenna/detector units to obtain a third vector sum, and sum the first, second and third vector sums to obtain a net azimuth bearing and an elevation bearing of an emission source of the electromagnetic radiation signals.

21. The device of claim 20 wherein the controller is further structured to obtain a relative magnitude of the emission source of the electromagnetic radiation signals.

* * * * *

UNITED STATES PATENT AND TRADEMARK OFFICE
CERTIFICATE OF CORRECTION

PATENT NO. : 8,401,488 B2
APPLICATION NO. : 13/081790
DATED : March 19, 2013
INVENTOR(S) : Sulkowski, Jr. et al.

Page 1 of 1

It is certified that error appears in the above-identified patent and that said Letters Patent is hereby corrected as shown below:

In the Claims:

Column 20, line 25, Claim 16, "radiation transmission" should read --radiation--.

Signed and Sealed this
Second Day of July, 2013

Teresa Stanek Rea
*Acting Director of the United States Patent and Trademark Office*